US006444990B1

(12) United States Patent
Morgan et al.

(10) Patent No.: US 6,444,990 B1
(45) Date of Patent: Sep. 3, 2002

(54) MULTIPLE TARGET, MULTIPLE ENERGY RADIOISOTOPE PRODUCTION

(75) Inventors: Ira Lon Morgan; Floyd Del McDaniel, both of Denton, TX (US); Pierre Grande, Santa Fe, NM (US); Jerry M. Watson, Midlothian, TX (US)

(73) Assignee: Advanced Molecular Imaging Systems, Inc., Denton, TX (US)

( * ) Notice: Subject to any disclaimer, the term of this patent is extended or adjusted under 35 U.S.C. 154(b) by 0 days.

(21) Appl. No.: 09/432,259

(22) Filed: Nov. 2, 1999

Related U.S. Application Data

(60) Provisional application No. 60/107,238, filed on Nov. 5, 1998.

(51) Int. Cl.[7] .......... H01J 37/30

(52) U.S. Cl. .......... 250/398; 250/396 R

(58) Field of Search .......... 250/398, 396 R, 250/492.21, 492.23

(56) References Cited

U.S. PATENT DOCUMENTS

| | | | | |
|---|---|---|---|---|
| 3,952,255 A | * 4/1976 | Passow | 328/233 |
| 4,485,346 A | * 11/1984 | Swenson | 328/233 |
| 4,639,634 A | 1/1987 | Meyrand | 313/62 |
| 4,870,287 A | 9/1989 | Cole et al. | 250/492.3 |
| 5,037,602 A | * 8/1991 | Dabiri | 376/198 |
| 5,073,913 A | * 12/1991 | Martin | 378/34 |
| 5,401,973 A | 3/1995 | McKeown et al. | 250/492.3 |
| 5,463,291 A | 10/1995 | Carroll et al. | 315/502 |

FOREIGN PATENT DOCUMENTS

FR 2 737 834 8/1996

OTHER PUBLICATIONS

"High Power Linear Accelerators for Tritium Production and Transmutation of Nuclear Waste", G. P. Lawrence, *Nuclear Instruments & Method in Physics Research, Section–B; Beam Interactions with Materials and Atoms,* vol. 56/57, May 1, 1991, pp. 1000,1004. North–Holland Publishing Company, Amsterdam, NL, ISSN: 0168–583X, p. 1002, right–hand column, paragraph 2, Figure 4.

"Kicker Thyratron Experience from SLC" *Conference Record of the 1991 IEEE Particles Acceleration Conference: Accelerator Science and Technology* (Cat. No. 91CH3038–7), San Francisco, Cam, USA, May 6–9, 1991, pp. 3165–3167, vol. 5, 1991, New York, NY, USA, IEEE, USA ISBN: 0–7803–0315–8, p. 3165, left–hand column, paragraph 1–paragraph 2.

"The Beam Sharing Project of the Hammersmith Cyclotron", G. Burton, W. L. Renton, and M. L. Simpson, *Ninth International Conference on Cyclotrons and Their Applications,* pp. 715–717k.

* cited by examiner

*Primary Examiner*—John R. Lee
*Assistant Examiner*—Anthony Quash
(74) *Attorney, Agent, or Firm*—Jerry M. Keys

(57) ABSTRACT

A multiple target array for receiving particles from a particle beam generator includes a particle beam transport path having a transport inlet and a transport outlet, the inlet receiving a particle beam from the particle beam generator. A kicker magnet is positioned along the particle beam transport path. The kicker magnet has an ON state and an OFF state and a kicker magnet inlet and a kicker magnet outlet. The array further includes a plurality of target paths, each of said target paths having a target inlet and terminating in a target. One of the target inlets is connected to the transport path adjacent to the kicker magnet outlet, and the particle beam in the transport path entering the kicker magnet inlet passes along the transport path through the kicker magnet outlet when the kicker magnet is in the OFF state, and the beam is directed to the target inlet when the kicker magnet is in the ON state.

4 Claims, 2 Drawing Sheets

MULTIPLE TARGET, MULTIPLE ENERGY RADIOISOTOPE PRODUCTION

RELATED APPLICATION

This application relies on provisional application Ser. No. 60/107,238, filed Nov. 5, 1998, and entitled "Multiple Target, Multiple Energy Radioisotope Production".

BACKGROUND OF THE INVENTION

1. Field of the Invention

The present invention relates to a multiple target station for multiple energy particle beam bombardment. The apparatus and method have particular utility in connection with radioisotope production.

2. Description of Related Information

The use of cyclotrons and linear accelerators for radioisotope production is known in the art. To produce a radioisotope, the accelerated particle beam produced by a cyclotron or linear accelerator is used to bombard a target.

For efficiency of production, it is desirable to simultaneously bombard multiple targets at multiple energies. To bombard multiple targets, geometrical splitting techniques are used on the accelerated particle beam. One such technique known in the art employs stripping foils, which may be configured to create electrostatic extraction channels to split the beam. However, the use of stripping foils creates limitations: only two, or perhaps three, targets can be simultaneously bombarded. An even greater drawback is that each individual target station is limited to a fixed, predetermined energy and a set fraction of the incident beam.

SUMMARY OF THE INVENTION

The present invention does not limit the number of targets that may be simultaneously bombarded. Additionally, each target may be used for the entire range of available energies. A further advantage of the present invention is that the fraction of the incident beam and the energy bombarding a single target can be readily adjusted.

The present invention employs a series of magnets placed along the path of the particle beam to control the beam. The magnets allow the beam to be focused, permitting the use of multiple energy levels. The magnets also allow the pulses of a pulsed particle beam to be directed towards individual targets on a pulse-by-pulse basis. Linear accelerators allow for particle beam pulses, or bursts, of several predetermined energy levels to be generated in a particle beam path.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PRESENT EMBODIMENT

Figure 1:
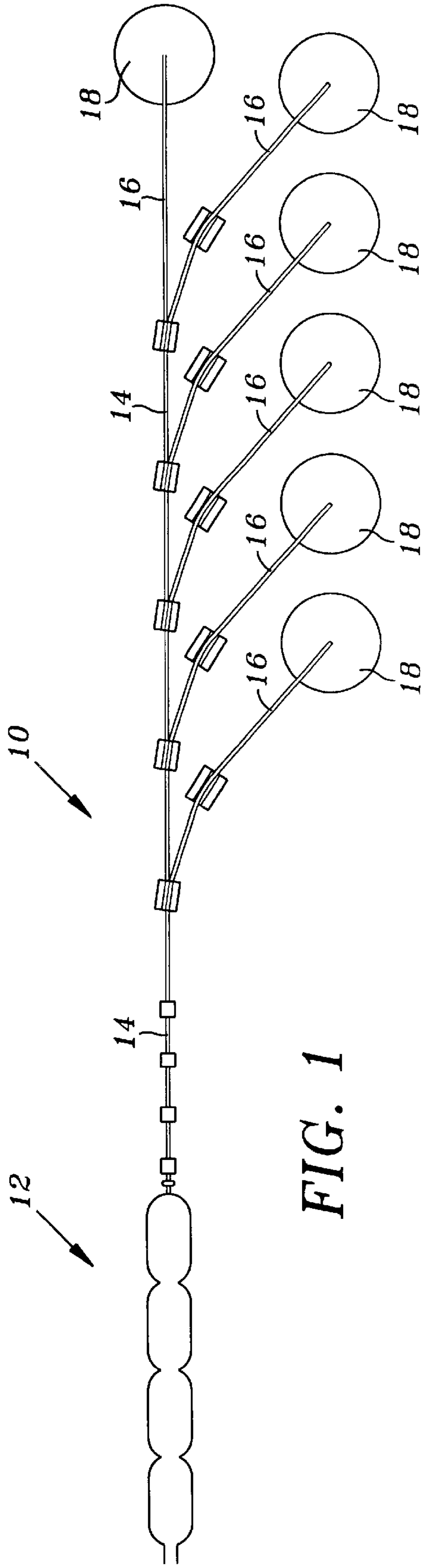
FIG. 1 depicts a particle beam transport system terminating in multiple target areas.

Referring now to FIG. 1, an embodiment of a particle beam transport system terminating in multiple target areas for a multiple energy, multiple target linear accelerator system is therein depicted, and is generally referred to by the numeral 10. A sequential array of particle beam accelerators 12 provides a particle beam. Connected to the sequential array 12 is a particle beam transport tube or path 14. The transport path 14 is defined by a sealed, enclosed tube. The purpose of the sealed tubular path is to allow the particle beam to travel in a vacuum along a predetermined route. A series of target paths 16 branch from the transport path 14. Similar to the transport paths 14, the target paths 16 are also sealed tubular enclosures. The target paths terminate at targets 18. An additional target 18 is placed at the termination of the transport path 14.

Figure 2:
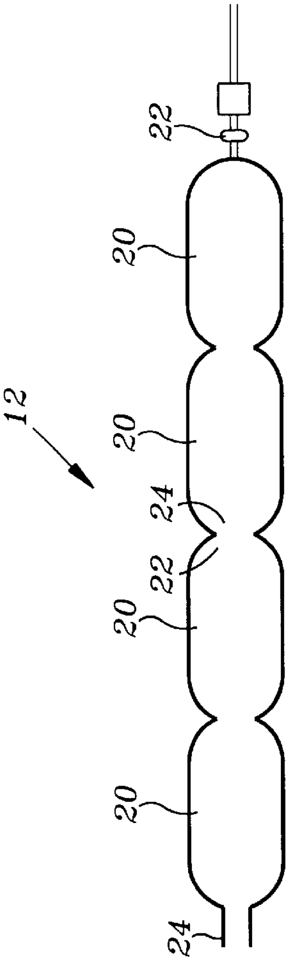
FIG. 2 depicts a sequential array of linear accelerators.

Turning now to FIG. 2, a sequential array 12 of linear accelerator tanks 20 is depicted. In the present embodiment of the invention, four drift tube linear accelerator tanks 20 are placed sequentially, or end-to-end, to create the sequential array 12. In this arrangement, the accelerator outlet 22 of one accelerator tank 20 is connected to the accelerator inlet 24 of the next accelerator tank 20 in a series, starting at an initial accelerator tank 20 and terminating at a terminal accelerator tank 20. The drift tubes in a linear accelerator tank 20 are pulsed to create a pulsed particle beam consisting of a series of particle bursts, or pulses. In the preferred embodiment, the pulses are output at a repetition rate of 360 Hz, which translates to a beam pulse every 2.8 milliseconds. The use of multiple linear accelerator tanks 20 allows for particle beams of a variety of energy levels to be generated. In the present embodiment of the invention, the first two linear accelerator tanks 20 are powered to generate a 33 meV particle beam. The third accelerator tank 20 may be used in conjunction with the first two tanks to produce a 51 meV particle beam, and all four accelerator tanks 20 may be used to produce a 70 meV beam. It will be apparent to those skilled in the art that different combinations of accelerators can be used to produce different or additional energy levels. The drift tubes in the accelerator tanks 20 can be pulsed on and off to vary the particle beam energy level from pulse to pulse.

Figure 3:
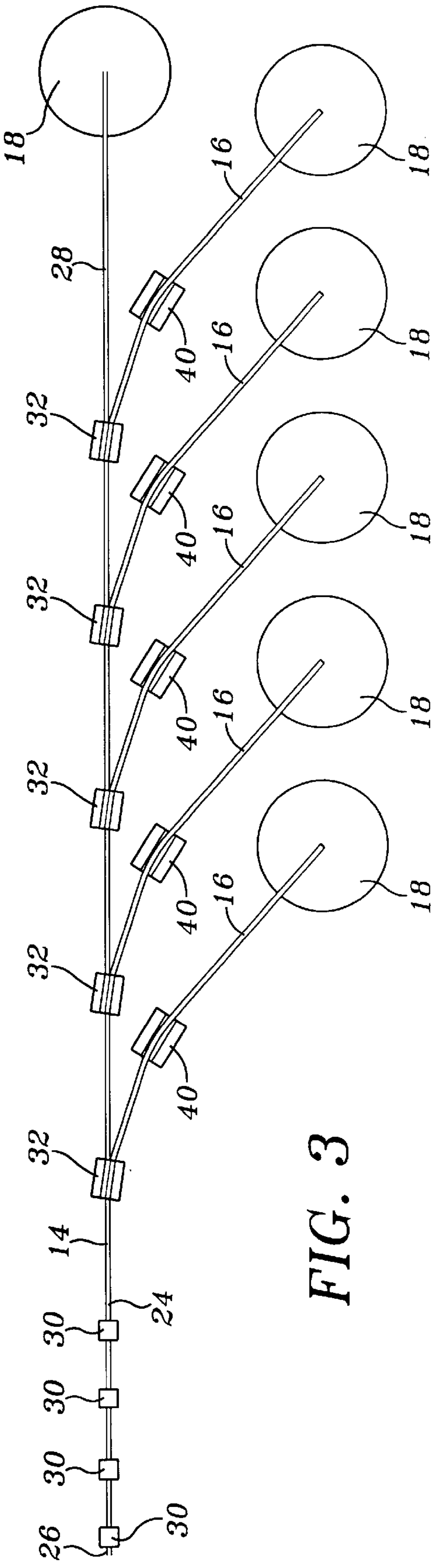
FIG. 3 depicts a multiple target array.

FIG. 3 depicts a multiple target array. The target array comprises the transport path 14 from the outlet 24 of the last accelerator tank 20, the target paths 16 deviating from the transport path 14 and the targets 18. The transport path 14, which is a sealed, enclosed tube 14, has a transport inlet 26 for receiving a particle beam from the particle accelerator tanks 20 (FIG. 3). The transport inlet 26 is connected to the accelerator outlet 24 at the termination of the sequential array 12. The transport path 14 terminates at a transport outlet 28.

A series of focusing magnets 30 are situated downstream of the transport inlet 26 along the transport path 14. After a pulsed particle beam produced by the sequential array 12 enters the transport path 14, the beam passes through the series of focusing magnets 30.

In the present embodiment, a series of four pulsed quadropole magnets are used as focusing magnets 30. The magnets have a central orifice through which the beam flows. For purposes of this invention, when a beam enters, travels or traverses, through a magnet, the point of entry into which the beam path enters the central orifice of the magnet is referred to as an inlet, and the point at which the beam path exits the central orifice is referred to as an outlet. In the present embodiment, all of the magnets are external to the transport path 14, such that the transport tube 14 passes through the central orifice of the magnet. The inlet and outlet nomenclature is also used when the beam enters or exits a tube or path, such as the transport path 14 or a target path 16, and the accelerator tanks 20.

The focusing magnets 30 are used to adjust, or focus, the particle beam. The pulsing of the focusing magnets 30 acts upon particle beams of different energy levels traversing the set transport path 14. A different magnetic field is required to properly focus the particle beam for each different energy level of pulse. The magnetic field generated by a focusing magnet 30 is varied by varying the current to the focusing magnet 30 from pulse to pulse. Each quadropole magnet 30 is powered by an individual pulsed power supply, which allows the current to be varied from pulse to pulse.

Figure 4:
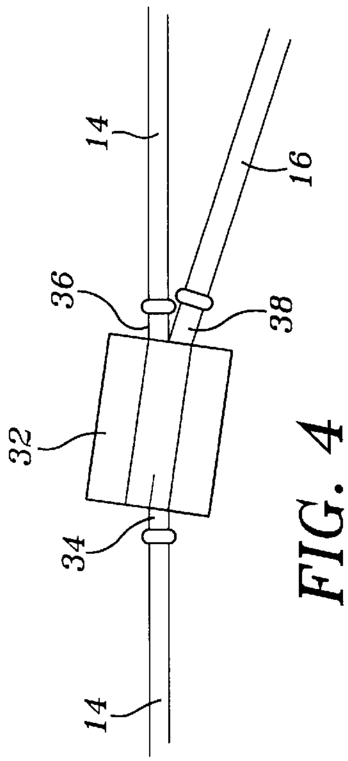
FIG. 4 is an expanded view of a kicker magnet, and the transport path and target path at the kicker outlet.

After the particle beam pulse is focused by the focusing magnets 30, the particles in the beam pulse travel further along the transport path 14. A series of kicker magnets 32 are disposed along the transport path 14 between the focusing magnets 30 and the transport outlet 28. Referring to FIG. 4, each kicker magnet 32 has a kicker inlet 34 through which the beam enters and a kicker outlet 36 through which the beam exits. In the present embodiment, pulsed dipole magnets located at regular intervals along the path serve as kicker magnets 32. The kicker magnets 32 can be pulsed by an electrical current, placing the kicker magnet 32 in an "on" state. When the kicker magnet 32 is on, magnet 32 will act upon the beam pulse traveling through the kicker magnet 32 by causing the pulse to deviate from the transport path 14. When the pulsed dipole magnet 32 is not pulsed by a current, the kicker magnet 32 is in its "off" state, and a beam traveling through the magnet is unaffected.

Target paths 16 branch, or deviate, from the transport path 14 and terminate in target stations 18. A beam enters the target path 16 through its target inlet 38. The target paths 16 branch off the transport path 14; the target inlets 38 are disposed adjacent to the kicker outlet 36 of each kicker magnet 32. The transport path 14 actually extends through the central orifice of the kicker magnet 32. At the kicker outlet 36, the transport path 14 continues, but a separate target path 16 deviates from the transport path 14 just after the transport path exits the kicker outlet 14.

In the preferred embodiment, the target paths 16 deviate from the transport path 14 at 14° angles. This angle was selected by the ability of a kicker magnet 32 to respond to a beam pulse of maximum system strength, which has been given as 70 meV in the present embodiment. It will be apparent to those skilled in the art that a different angle could be used for kicker magnets of different strengths or for different maximum beam energy levels. Because the incident angle of the target path 14 is fixed in the system of the present invention, the strength of the magnetic field produced by the kicker magnet 32 must be adjusted for the energy level of the beam pulse, so that the beam pulse enters the target path 16. The variation in the strength of the magnetic field produced by the kicker magnet 32 is achieved by varying the current to the kicker magnet 32.

Returning to FIG. 3, it should be noted that for physical layout purposes, it is desirable to minimize the length of the transport path 14 and the target paths 16 and the area between the target stations 18. The paths may be shortened, and the target stations 18 may be placed closer to one another, by bending the target paths 16. The beam pulse is steered along the bent target path 16 through the use of a deflecting magnet 40. In the present invention, a dipole bending magnet is used as a deflecting magnet 40. The target path 16 is bent at a 31° angle, so the deflecting magnet 40 is energized to deflect each pulse traversing the target path 16 at that angle to maintain a beam pulse along the target path 16. It will be apparent to one skilled in the art that different angles, different or additional deflecting magnets, or variations in placement of the target stations 18 relative to the transport path 14 could be used for different physical layouts.

In the present embodiment, a total of five kicker magnets 32 are employed. Each of the five kicker magnets 32 can deviate a particle beam into a target path 16 terminating in a target 18. The target inlet 38 of an additional target path 16 is connected to the terminal outlet 28. In the present embodiment, a deflecting magnet 40 is not present in the target path 16 connected to the terminal outlet 28, in order to minimize the length of the particular target path. The target 18 of this particular target path 16 may also be used as a dump station for unwanted pulses. Therefore, the described embodiment has a total of six targets 18. However, the number of kicker magnets 32 can be varied to vary the number of targets 18.

To allow the electrical current input to each kicker magnet 32 to be readily adjusted, each kicker magnet 32 is powered by an individual pulsed power supply. Individual power supplies allow the current to each kicker magnet 32 to be individually selected, so that each kicker magnet 32 can be turned on and off individually. The focusing magnets 30 are also powered by individual pulsed power supplies which allows the magnetic field of each individual focusing magnet 32 to be set independently. Therefore, the spacing between the focusing magnets 30 does not limit the system to a particular beam wavelength.

In the present invention, a computerized control system controls the power supply for each focusing magnet 30 and for each kicker magnet 32. The power supplies ultimately control the state and the strength of the magnetic field output of each kicker magnet 32 or focusing magnet 30. In the case of the focusing magnets 30, the control system adjusts the current, which powers the magnets to an appropriate level for the power of each particle beam pulse. In the case of the kicker magnets 32, the control system controls the state of each kicker magnet 32, determining whether a beam pulse is sent to the target 18 associated with the kicker magnet 32 or further down the transport path, as well as the strength of the kicker magnet 32 field. For example, the control system controls the pulsed power supply for the first pulsed kicker magnet 32 to output a selected current pulse, such that the pulsed magnet reaches a proper magnetic field level to divert the desired beam pulse by 14° before a desired beam pulse enters the kicker magnet 32 which causes the desired beam pulse to deflect to the first target station 18. The current may then be controlled so that the magnetic field level in the pulsed kicker magnet 32 will return to zero (placing the kicker magnet 32 in its "off" state) before the next beam pulse arrives. For the next pulse, when the power supply does not output a pulsed current, the beam pulse will not be deflected and will travel to the next kicker magnet 32. If the second kicker magnet 32 receives an appropriate current pulse from its power supply, the beam pulse will be deflected to the second target station 18. If no current pulse is sent from the power supply of the second kicker magnet 32 to the magnet, the beam will continue to the third kicker magnet 32.

The controller repeats the above selection process at each kicker magnet 32, thus allocating the beam pulses amongst the multiple targets 18. If no kicker magnets 32 are pulsed, the beam pulse is directed to a beam dump or target 18 beyond the transport outlet 28. Different energy beams are directed to the desired target 18 by ensuring that the proper magnetic field level is produced in the kicker magnets 32.

Additions to the present invention can be employed to ensure an efficient system. For example, FODO (focusing-defocusing) quadropole magnets may be placed along the transport path 14 to maintain the beam focus as it traverses the transport path 14. Sensors placed along the transport path 14 can relay data to a computerized control system. Focusing magnets in the target path 16 immediately prior to the targets 18 can ensure the precision of the beam prior to its bombardment into the target 18. These magnets are set to bend and focus the desired output beam pulse.

While a preferred embodiment of the a particle beam transport system terminating in multiple target areas has been described in detail, it should be apparent that modifications and variations thereto are possible, all of which fall within the true spirit and scope of the invention. For example, the present invention may be adapted for use with any suitable particle beam accelerator; a different number of accelerators could be used for a different number of energy levels; and the multiple energy levels could be achieved by funneling the output of multiple particle beam accelerators with deflecting magnets rather than using sequential placement. Different types of beam path energizers may be substituted for the magnets. The controller may consist of a microprocessor or other computerized devices. Additionally, different configurations of magnets can be used to allow for additional target areas.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. An apparatus for producing particle beam pulses at a repetition rate greater than 100 Hz at multiple energy levels comprising a plurality of linear accelerators, each of said plurality of linear accelerators having an accelerator inlet and an accelerator outlet wherein said plurality of linear accelerators are positioned with an accelerator outlet of one linear accelerator connected to an accelerator outlet of a next linear accelerator to create a sequential array, and wherein each of said plurality of linear accelerators are individually pulsed to produce each of said multiple energy levels of said beam pulses, and wherein energy levels of each of the beam pulses vary between each of the beam pulses.

2. The apparatus of claim 1 further comprising:

a particle beam transport path having a transport inlet and a transport outlet, said inlet connected to one of said accelerator outlets at a termination of said sequential array;

a plurality of target paths, each of said target paths having a target inlet and termination in a target;

a plurality of kicker magnets positioned adjacent to said particle beam transport path, each of said plurality of kicker magnets having an ON state and an OFF state and a kicker magnet inlet and a kicker magnet outlet;

wherein each of said plurality of target inlets is connected to said transport path adjacent to a corresponding kicker magnet outlet and said transport outlet is connected to one of said target inlets, and wherein each of said kicker magnet inlets receives said beam pulses, passes said beam pulses through said kicker magnet outlet along said transport path when said kicker magnet is in the OFF state, and redirects said beam pulses to said target inlet when said kicker magnet is in said ON state.

3. The multiple target array of claim 2 further comprising a plurality of focusing magnets in said transport path positioned between said sequential array of said particle beam accelerators and plurality of, kicker magnets.

4. The multiple target array of claim 3 further comprising a deflecting magnet disposed in each of said plurality of target paths for deflecting the beam in said target path, thereby allowing a bend in said target path.

* * * * *

UNITED STATES PATENT AND TRADEMARK OFFICE

CERTIFICATE OF CORRECTION

PATENT NO. : 6,444,990 B1 Page 1 of 1
DATED : September 3, 2002
INVENTOR(S) : Ira Lon Morgan, Floyd Del McDaniel, Pierre Grande and Jerry M. Watson It is certified that error appears in the above-identified patent and that said Letters Patent is hereby corrected as shown below:

Column 6,
Line 30, remove "," after -- of --.

Signed and Sealed this

Eleventh Day of February, 2003

JAMES E. ROGAN
*Director of the United States Patent and Trademark Office*